(12) United States Patent
Lee

(10) Patent No.: US 7,274,236 B2
(45) Date of Patent: Sep. 25, 2007

(54) VARIABLE DELAY LINE WITH MULTIPLE HIERARCHY

(75) Inventor: Seong-Hoon Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 46 days.

(21) Appl. No.: 11/107,587

(22) Filed: Apr. 15, 2005

(65) Prior Publication Data

US 2006/0232315 A1 Oct. 19, 2006

(51) Int. Cl.
*H03L 7/06* (2006.01)

(52) U.S. Cl. .................................... 327/261; 327/158

(58) Field of Classification Search ................ 327/149, 327/153, 158, 161, 261, 262, 270–271, 276, 327/284; 331/1 A, 17, 25; 375/373–376
See application file for complete search history.

(56) References Cited

U.S. PATENT DOCUMENTS

| | | | |
|---|---|---|---|
| 4,985,639 A | 1/1991 | Renfrow et al. | 327/243 |
| 5,355,097 A | 10/1994 | Scott et al. | 331/1 A |
| 5,463,337 A | 10/1995 | Leonowich | 327/158 |
| 5,663,665 A | 9/1997 | Wang et al. | 327/3 |

(Continued)

OTHER PUBLICATIONS

U.S. Appl. No. 10/722,959, filed Nov. 26, 2003, Lee.

(Continued)

*Primary Examiner*—Linh My Nguyen
(74) *Attorney, Agent, or Firm*—Wong, Cabello, Lutsch, Rutherford & Brucculeri, LLP

(57) ABSTRACT

Disclosed herein are improved, simplified designs for a hierarchical delay line (HDL). The HDL is useful in providing precise phase control between an input clock signal and an output clock signal, and has particular utility as the variable delay in a delay-locked loop (DLL). In one embodiment, a coarse unit delay provides a delayed representation of an input clock. The original and delayed versions of the input clock are presented to a phase mixer block, which is controllable to weight its output to a phase between one of the two input clock signals. The output of the phase mixer block is then provided to a controllable variable delay line capable of adding further coarse delay into the processed signal. To assist in boundary switching, multiplexers are provided in the path between the original and delayed versions of the input clock and the phase mixer block, which provides the ability to boundary shift without having to reset the phase mixer.

34 Claims, 6 Drawing Sheets

U.S. PATENT DOCUMENTS

| | | | |
|---|---|---|---|
| 5,751,665 A | 5/1998 | Tanoi | 368/120 |
| 5,789,927 A | 8/1998 | Belcher | 324/622 |
| 5,872,488 A | 2/1999 | Lai | 331/57 |
| 6,100,736 A | 8/2000 | Wu et al. | 327/159 |
| 6,194,916 B1 | 2/2001 | Nishimura et al. | 327/12 |
| 6,194,947 B1 | 2/2001 | Lee et al. | 327/359 |
| 6,295,328 B1 | 9/2001 | Kim et al. | 375/376 |
| 6,313,688 B1 | 11/2001 | Lee et al. | 327/359 |
| 6,326,826 B1 | 12/2001 | Lee et al. | 327/161 |
| 6,366,148 B1 | 4/2002 | Kim | 327/262 |
| 6,393,083 B1 | 5/2002 | Beukema | 375/371 |
| 6,441,659 B1 * | 8/2002 | Demone | 327/156 |
| 6,512,408 B2 | 1/2003 | Lee et al. | 327/359 |
| 6,573,771 B2 | 6/2003 | Lee et al. | 327/158 |
| 6,618,283 B2 | 9/2003 | Lin | 365/141 |
| 6,642,760 B1 | 11/2003 | Alon et al. | 327/158 |
| 6,661,863 B1 | 12/2003 | Toosky | 375/376 |
| 6,762,633 B2 | 7/2004 | Lee | 327/15 |
| 6,768,361 B2 | 7/2004 | Kwak | 327/158 |
| 6,812,753 B2 | 11/2004 | Lin | 327/155 |
| 6,943,602 B1 * | 9/2005 | Lee | 327/158 |
| 7,142,026 B2 * | 11/2006 | Kwak | 327/158 |
| 2003/0219088 A1 | 11/2003 | Kwak | 375/376 |
| 2004/0217789 A1 | 11/2004 | Kwak | 327/158 |
| 2005/0170805 A1 * | 8/2005 | Hammes et al. | 455/255 |

OTHER PUBLICATIONS

Jong-Tae Kwak, *A Low Cost High Performance Register-Controlled Digital DLL for 1 Gbps x32 DDR SDRAM*, The 8th Korean Conference on Semiconductors, Feb. 2001.

Ramin Farjad-Rad, *A Low-Power Multiplying DLL for Low-Jitter Multigigahertz Clock Generation in Highly Integrated Digital Chips*, IEEE Journal of Solid-State Circuits, vol. 37,. No. 12, Dec. 2002, p. 1804-1812.

* cited by examiner

US 7,274,236 B2

1

VARIABLE DELAY LINE WITH MULTIPLE HIERARCHY

FIELD OF THE INVENTION

Embodiments of this invention relate to an improved hierarchical delay line with particular utility for adjusting the phase shift of a clock signal in a delay-locked or phase-locked loop.

BACKGROUND

It is often desired in an integrated circuit to delay a signal. In the context of a periodic signal like a clock signal, adjustment of delay can be understood as an adjustment of the phase of the signal. Such phase shifting of a clock signal is particularly useful as applied to delay lock loops (DLLs) or phase lock loops (PLLs) that are used to generate internal clock signals for an integrated circuit from a master clock signal. Because the of complexity of modern-day integrated circuits, the ability to finely shift the phase of clock signal is particularly important to ensure proper timing within the circuit.

Techniques have been previously disclosed to provide such fine phase shifts in clock signals. See, e.g., U.S. patent application Ser. No. 10/722/959 ("the '959 application"), entitled "Digital Delay-Locked Loop Circuits with Hierarchical Delay Adjustment," filed Nov. 26, 2003, and assigned to the assignee of the present application, Micron Technology, Inc. As the present application builds on the techniques disclosed in the '959 application, the '959 application is hereby incorporated by reference in its entirety. The reader's knowledge of the '959 application is presumed, and as a result a detailed discussion of background is limited in this disclosure.

In the '959 application, a hierarchical delay line 10 is disclosed, which is illustrated in FIGS. 1A and 1B of the present application. These hierarchical delay lines 10 are used to finely adjust the phase difference of the output signal (Clk_Out) relative to the input signal (Clk_In). Both delay lines 10 are hierarchical, meaning that each has a number of different stages involved in "fine tuning" the phase shift. FIG. 1A has a dual hierarchy, while FIG. 1B has a triple hierarchy. Discussed below is the operation of the triple hierarchy delay line 10 of FIG. 1B.

The first stage in FIG. 1B comprises two variable delay lines (VDLs) 12, 14 used to provide a coarse phase shift in the input signal. The coarse phase shift is determined by VDL control signals (VDLcntr) to the VDLs 12, 14, which is shown in further detail in FIG. 1C. As shown, multiple control signals (Sel<1:4>) are used for each VDL 12, 14. Depending on which Sel<x> signal is chosen, the input signal (Clk_In) will be delayed through the various "coarse units delays" (CUDS) provided by the VDL 12, 14. In the example shown in FIG. 1C, there are four Sel<x> control signals and hence four CUD stages, which can cause the input signal to be delayed by 1, 2, 3, or 4 CUDs (i.e. from tCUD to 4tCUD). It is worth mentioning that other types of VDLs can be used besides the circuitry shown in FIG. 1C.

In the second stage of the triple hierarchical delay line of FIG. 1B, phase mixers (PM) 16, 18 are used to provide an intermediate phase between the two phases output from the VDLs 12, 14 (i.e., inA, inB). This is only briefly explained as the same is well explained in the above-incorporated '959 application. As shown in FIG. 1D, the phase mixers 16, 18 comprise two variable inverters 19, 21. The variable inverters 19, 21 are controllable using control signals S<1:N>,

2 corresponding to phase mixer control signals (PMcntrx) from FIGS. 1A and 1B. The circuitry for the variable inverters 19, 21, shown to the right in FIG. 1D, allows, depending on the signals S<x> chosen, the output of the phase mixer to be "weighted" between one of the two input phases (inA, inB). For example, if all signals S<x> are high, the output will equal inB (i.e., k=1). If all signals S<x> are low, the output will equal inA (k=0). If only some are chosen (e.g., half), then the output will be the intermediate phase between inA and inB, as shown at the bottom of FIG. 1D (k=0.5). ("k" equals p/N, where p equals the number of S<x> signals activated (0 through N), and N equals the total number of S<x> signals). In any event, in this second stage, the phase difference between the VDLs 12, 14, is tailored so that the outputs of the phase mixers 16, 18, express an even finer phase difference.

Referring again to FIG. 1B, in the third stage, the outputs from the two phase mixers 16, 18, are sent to another similar phase mixer 20. Here again, the fine phase difference between the inputs to the third stage are once again rendered finer still at the output of third stage, Clk_Out, i.e., the output of the hierarchical delay line 10.

In this way, a very tightly controlled phase difference may be expressed between the Clk_In signal and the Clk_Out signal. For example, if we assume that the first (coarse) stage gave rise to a phase shift of tCUD, and that each of the phase mixers 16, 18, and 20 can generate N phases (i.e., there are N control signals S<N>), then the second stage can vary the phase in increments of tCUD/N, and the third stage (i.e., the entirety of the hierarchical delay line 10) can vary the phase in increments of tCUD/N^2. For example, if tCUD=90 degrees, and if each phase mixer 16, 18, 20 had three control signals (i.e., N=3), then the hierarchical delay line 10 can vary the phase difference between Clk_In and Clk_Out in 10 degree increments. Of course, and as explained in the '959 application, further fine-adjustment phase mixer stages can be added to even further reduce the phase increment between Clk_In and Clk_Out. For example, for Q phase mixer stages, and assuming N control signals in the phase mixers at each stage, the increment value would equal tCUD/N^Q. Through such fine phase shift control, phase shifts on the order of picoseconds can be achieved.

While satisfactory in operation, the hierarchical delay lines 10 of FIGS. 1A and 1B have disadvantages. For example, the VDL blocks 12, 14 in the circuit are very layout intensive and consume significant power. Although only a few CUD stages are shown in the VDL of FIG. 1C, in reality a VDL would contain tens of CUDs. This in turn necessitates many control signals Sel<x> and logic to generate them. In short, it can be argued that the approach of the hierarchical delay lines 10 of FIGS. 1A and 1B are generally too big, too complicated, and too power-intensive.

SUMMARY

Disclosed herein are improved, simplified designs for a hierarchical delay line (HDL). The HDL is useful in providing precise phase control between an input clock signal and an output clock signal, and has particular utility as the variable delay in a delay-locked loop (DLL). In one embodiment, a coarse unit delay provides a delayed representation of an input clock. The original and delayed versions of the input clock are presented to a phase mixer block, which is controllable to weight its output to a phase between one of the two input clock signals. The output of the phase mixer block is then provided to a controllable variable delay line capable of adding further coarse delay into the processed signal. To assist in boundary switching (i.e., at the edges of the coarse units delays), multiplexers are provided in the path between the original and delayed versions of the input clock and the phase mixer block, which provides the ability to boundary shift without having to reset the phase mixer block. Several phase mixers stages can be cascaded in the phase mixer block to provide even finer control of the phase of the resulting output signal of the hierarchical delay line.

BRIEF DESCRIPTION OF THE DRAWINGS

Embodiments of the inventive aspects of this disclosure will be best understood with reference to the following detailed description, when read in conjunction with the accompanying drawings, in which.

DETAILED DESCRIPTION

Figure 1A:
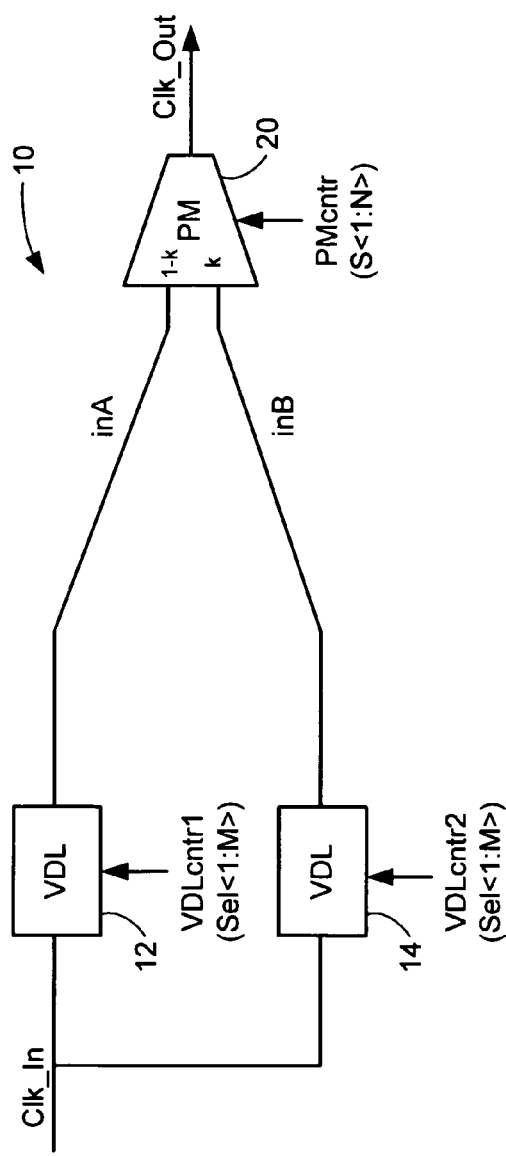
FIGS. 1A and 1B illustrate prior art hierarchical delay lines, with FIG. 1A representing a dual stage line, and FIG. 1B representing a triple stage line.
Figure 1B:
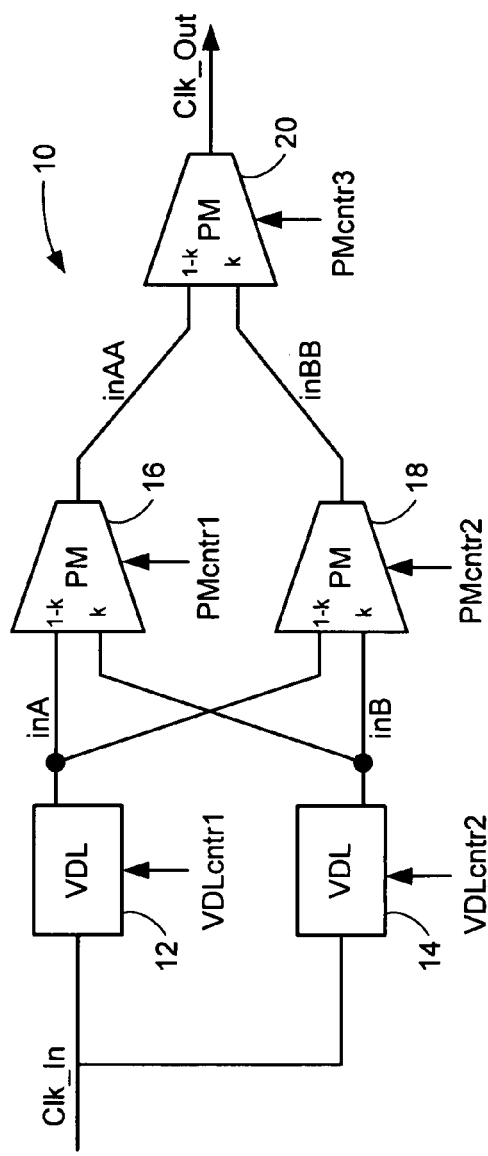
Figure 2:
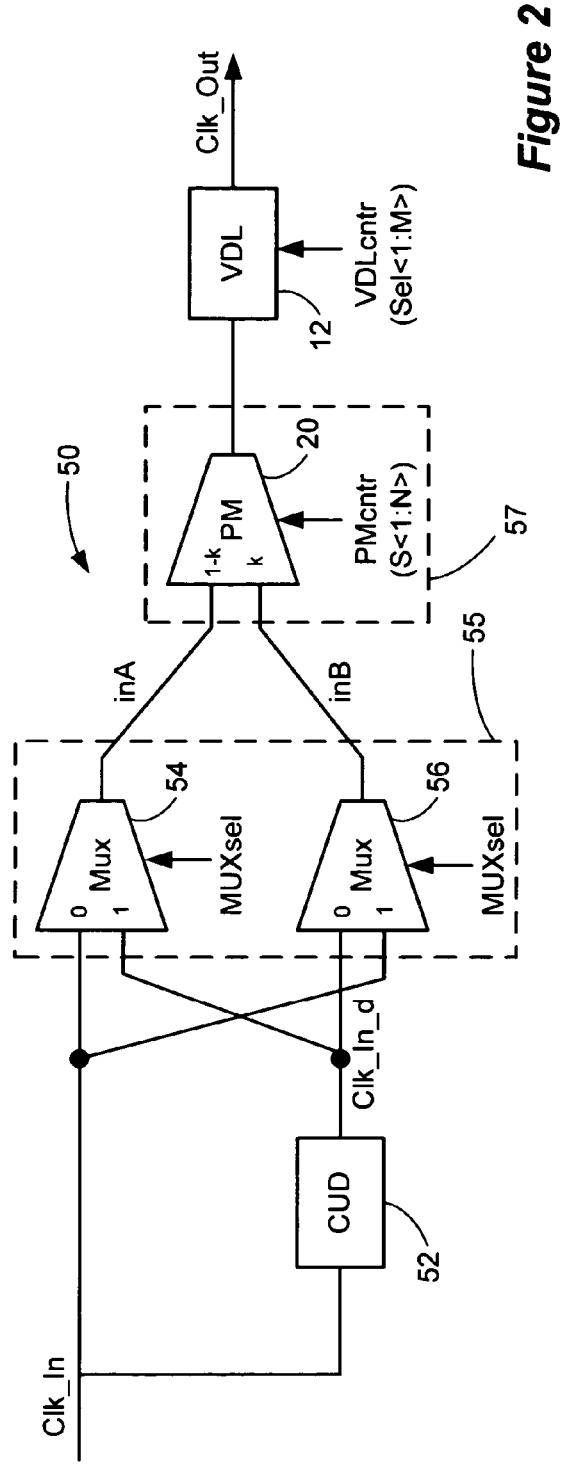
FIG. 2 illustrates a dual stage hierarchical delay line in accordance with an embodiment of the invention.

FIG. 2 shows an embodiment of an improved, simpler hierarchical delay line 50. The hierarchical delay line 50 of FIG. 2 is a dual stage hierarchical delay line similar in performance to the prior art dual stage hierarchical delay line 10 shown in FIG. 1A. However, the basic hierarchical delay line can be made with multiple hierarchy, i.e., which multiple stages, such as the three stage hierarchical delay line 60 shown in FIG. 3 (akin to the triple hierarchy line 10 of FIG. 1B), or any multiple number of stages, as shown in hierarchical delay line 70 of FIG. 4.

Referring initially to FIG. 2, the new hierarchical delay line circuit 50 is similar to the circuit of FIG. 1A. However, the variable delay lines (VDLs) 12, 14 (FIG. 1A) have been removed from the front of the circuit, and replaced with a single coarse unit delay (CUD) 52. A single VDL has been placed after the phase mixer block 57, as will be explained in further detail later. Also added to the new hierarchical delay line circuit 50 is a switch circuit 55, whose function will be explained further below. While a comparison of the circuits of FIG. 2 and the comparable circuit of FIG. 1A may look similarly complex, in reality the circuit of FIG. 2 is much less complicated to layout on an integrated circuit, consumes less power, has fewer control signals, and in sum is a simpler circuit.

Figure 1C:
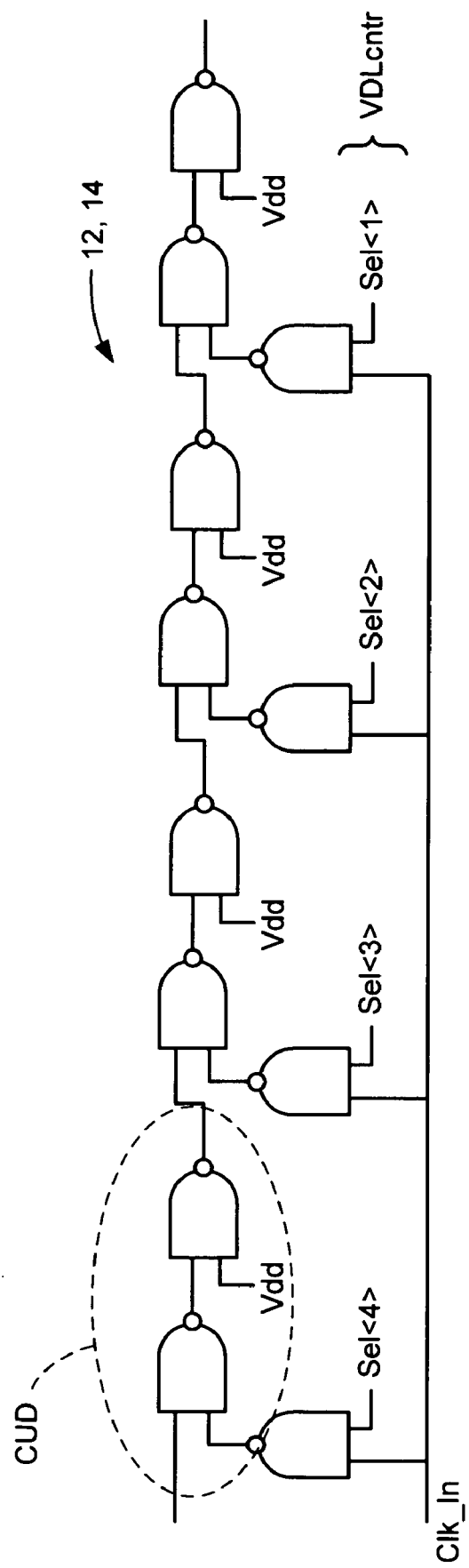
FIG. 1C illustrates the variable delay line used in FIGS. 1A and 1B.

In discussing the operation of the new hierarchical delay line 50, discussion focuses primarily on a discussion of the two stage embodiment of FIG. 2. The Clk_In signal is split in two, with a delayed representation of the Clk$_{13}$ In (Clk_In_d) being generated by a single CUD stage 52. This CUD stage 52 can be as illustrated in FIG. 1C, or can be any sort of delay circuit commonly used in the art. As shown, CUD stage 52 is not controllable to provide a variable delay, but could be so if desired. It is preferable that the CUD stage 52 be set to one delay unit (i.e., tCUD), and hence Clk_In_d would be delayed from Clk_In by tCUD.

Clk_In and Clk_In_d are sent to a switch circuit 55, which is one embodiment comprises two multiplexers 54, 56. Control signal MUXsel chooses either one of these two signals for presentation to the inputs (inA and inB) to the phase mixer block 57. Thus, if MUXsel is low, then inA=Clk_In and inB=Clk_In_d; if high, then inA=Clk_In_d and inB=Clk_In. The multiplexers 54, 56, are particularly useful for the reasons explained below, but not all useful embodiments of the hierarchical delay line require the use of the multiplexers 54, 56. Instead, signals Clk_In and Clk_In_d could be sent directly to the inputs of the phase mixer block 57. Although the use of the two multiplexers 54, 56, is preferred, the switch circuit could be comprised of other structures, as one skilled in the art will appreciate.

The Clk_In and Clk_In_d signals are processed at the phase mixer block 57, which in FIG. 2 comprises a single phase mixer 20. The phase mixer 20 is as described earlier in the background section. By way of review, depending on the number of PMcntr signals utilized (N), the phase difference between inA and inB can be further parsed to provide an output which intervenes between the two phases. For example, suppose Clk_In's phase is 0 degrees, and Clk_In_d's phase is 30 degrees by virtue of tCUD. If, N=5, then the phase of the signal emerging from the phase mixer 20 can be 0 degrees (p=0, meaning none of the N control signals S<x> are activated, i.e., k=0); 6 degrees (p=1, k=0.2); 12 degrees (p=2, k=0.4); 18_degrees (p=3, k=0.6); 24 degrees (p=4; k=0.8); or 30 degrees (p=5; k=1.0).

Figure 3:
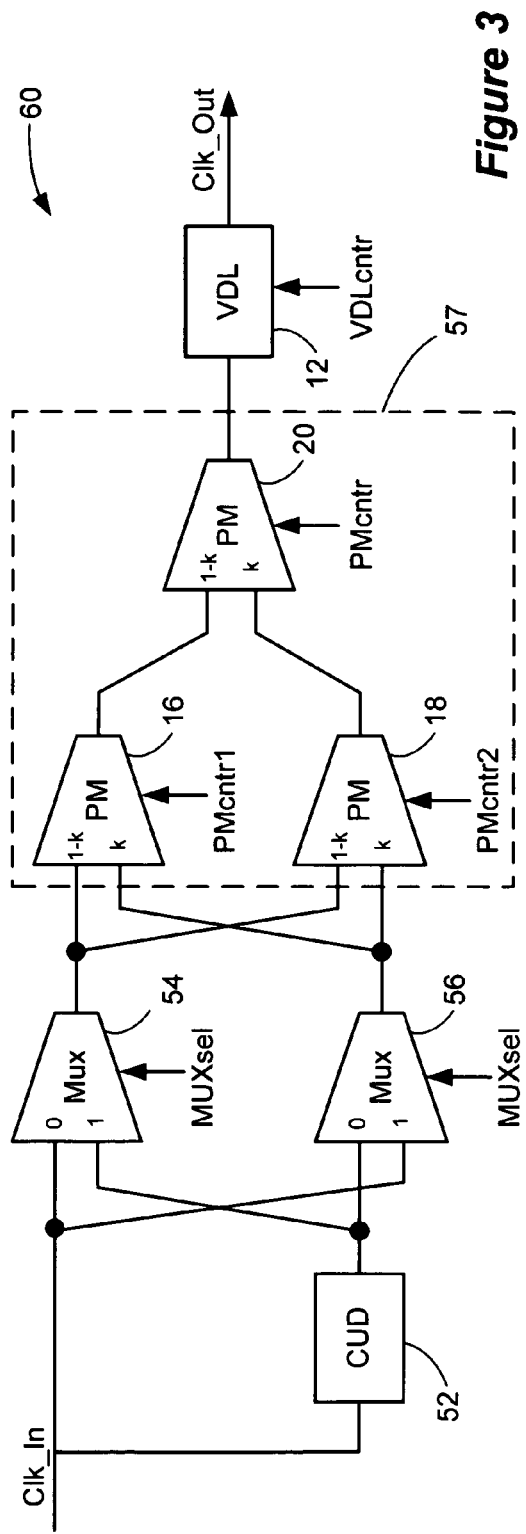
FIG. 3 illustrates a triple stage hierarchical delay line in accordance with an embodiment of the invention.
Figure 4:
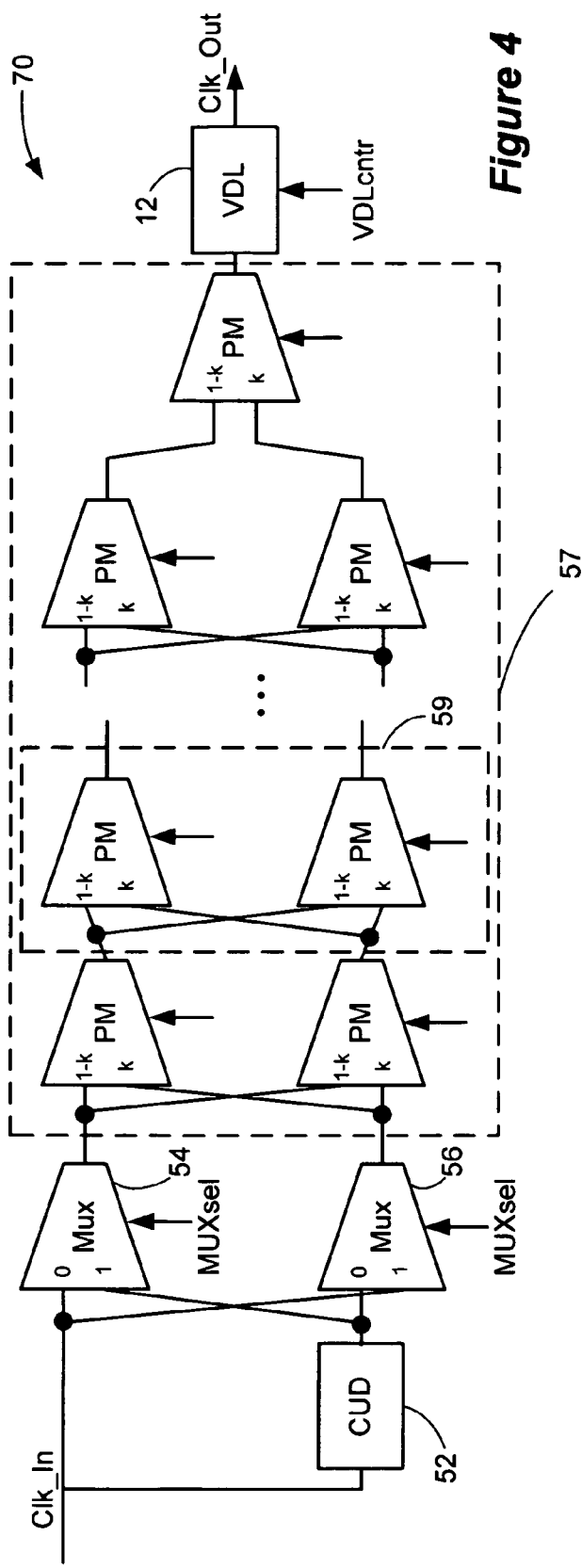
FIG. 4 illustrates a multiple stage hierarchical delay line in accordance with an embodiment of the invention.

The phase mixer block 57 can comprise more than a single phase mixer 20, as shown in FIG. 3 (triple hierarchy) and FIG. 4 (multiple hierarchy). In so doing, sets 59 (see FIG. 4) of phase mixers can be serially coupled to even further refine the phase of the output signal. For example, and referring briefly to FIG. 3, were the outputs from phase mixers 16 and 18 at 18 and 24 degrees, treatment at phase mixer 20 could be used, assuming an adequate number of control signals S<x>, to output a signal with very tightly controlled phases of 18, 19, 20, 21, 22, 23, or 24 degrees.

Figure 1D:
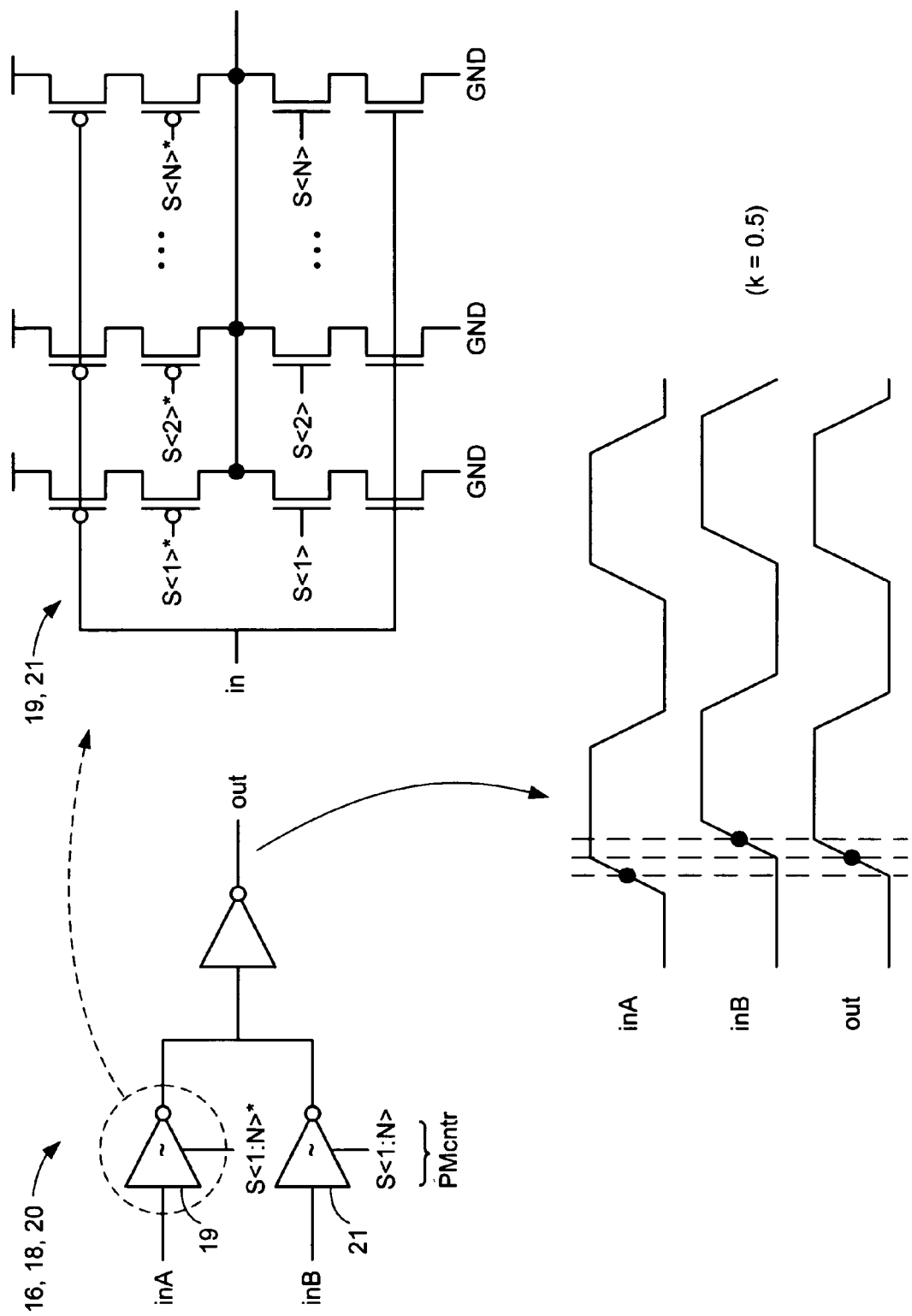
FIG. 1D illustrates the phase mixers used in FIGS. 1A and 1B.

Ultimately, the output of the phase mixer block 57 is met by a VDL circuit 12. The VDL 12 can be as depicted in FIG. 1D, but can comprise other variable delay circuits known in the art. VDL 12 provides a coarse phase shift to the otherwise fine phase shift adjustment that took place in the earlier stage(s). This is necessary because usually no mechanism will exist earlier in the circuit to allow a phase shift through a full 360 degrees. For example, in the earlier example, it was assumed that the CUD stage 52 provided only a 30 degree shift in the Clk_In signal. Without the benefit of VDL stage 12, the resulting output of the hierarchical delay line 50 would be only between 0 and 30 degrees. Accordingly, the VDL stage is used to add significant delay to allow the Clk_In signal to be phase shifted through a full 360 degrees. Thus, continuing the example, if CUD stage 52 provided a delay of 30 degrees, the VDL stage 12, assuming it is configured of similar CUD stages, would need eleven CUD stages (i.e., 330 degrees) to allow the full 360 degree phase shift to be realized between Clk_In and Clk_Out. In short, assuming the circuit of FIG. 2, m active CUD stages in VDL 12, and p activated control signals S<x> in the phase mixer 20, the total phase shift will be k*N*tPM+m*tCUD (ignoring propagation delays in the various stages).

Therefore, and continuing this example, a zero degree phase shift in Clk_Out result when k=0 and m=0, i.e., Clk_In is passed through the phase mixer 20 without mixing with Clk_In_d and no CUDs are active in the VDL 12. (Also, m=0 would be possible by bypassing VDL but which is not shown in FIG. 2). To increase the delay to 30 degrees, k can be increased toward 1 to blend in increasing portions of Clk_In_d. After 30 degrees, a CUD delay can be added in the VDL 12, and k reset back to zero. To further increase to 60 degrees, k can again be increased to 1. After 60 degrees, another CUD delay (i.e., two delays) can be added in the VDL 12, and k again reset to zero, etc. In short, through manipulation of the various control signals Sel<1:M> and S<1:N>, an entire 360 degree phase differential can be established between Clk_In and Clk_Out.

However, the switch 55, comprising multiplexers 54 and 56 in one embodiment, can also be used when crossing a CUD boundary (i.e., every 30 degrees in the example). For example, suppose the boundary at 30 degrees is to be crossed. Instead of resetting k back to zero while adding a CUD stage to the VDL 12, the multiplexers 52, 54 can be activated while keeping k at 1. Thus, by changing MUXsel from 0 to 1, the Clk_In and Clk_In_d inputs to the phase mixer 20 are switched, such that inA=Clk_In_d and inB=Clk_In. Because k=1, the Clk_In signal will dominate at the phase mixer 20. Moreover, the phase shift through the phase mixer 20 can now be increased by smoothly reducing k. Thus to cross the boundary at 30 degrees, for example, initially no CUD stages are active in the VDL 12. k is increased smoothly from 0 to 1, bringing the phase shift to 30 degrees. Then the multiplexers are activated, and a CUD stage is added to the VDL. Then by reducing k smoothly from 1 to 0, the range from 30 to 60 degree can be transgressed. At 60 degrees, another CUD delay be added to the VDL (2 CUD stages), and the multiplexer deactivated, such that smoothly changing k from 0 to 1 will transgress the range from 60 to 90, etc.

In short, boundary crossing can be facilitated by the switch circuit 55 without having to change the value of k sharply at the phase mixer 20. This is preferable, because a sharp transition of k from 0 to 1 (or vice versa) can cause noise in the output of the phase mixer 20. However, switching the multiplexers 54, 56 can too cause noise, and in this regard it is preferred to switch the multiplexers (via MUXsel) during periods when both Clk_In and Clk_In_d are in the low portions of their oscillations. Moreover, it is preferred to switch VDLcnrt (i.e., the Sel<1:M> signals), during low portions of the oscillation of the output of the phase mixer 20.

Figure 5:
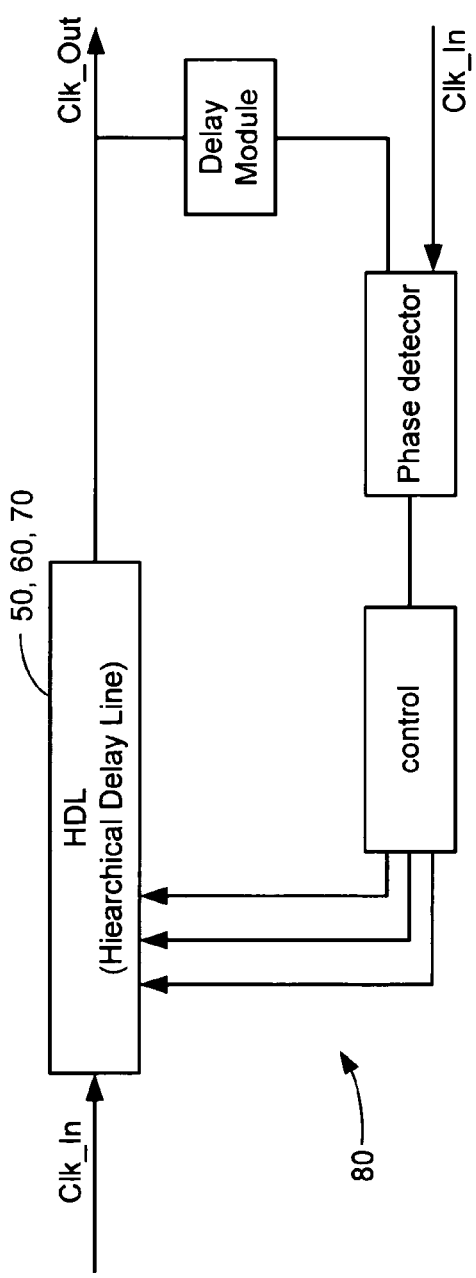
FIG. 5 illustrates a delay-locked loop benefited by the use of the disclosed improved hierarchical delay line.

FIG. 5 shows the utility of the disclosed hierarchical delay line 50 in the context of a delay-locked loop (DLL) 80, such as can occur on an integrated circuit such as a memory chip (e.g., a synchronous DRAM). As one skilled in the art understands the operation of a DLL, such is only briefly discussed. The disclosed closed loop can work to either bring Clk_Out into phase with Clk_In, or Clk_Out can lead Clk_In by the time delay of the delay module. The phase detector can determine whether the output of Delay Module precedes or lags Clk_In, and the control block can then send various control signals to the disclosed hierarchical delay line (e.g., MUXsel, Sel<1:M>, S<1:N>), to adjust the delay as necessary.

Figure 6:
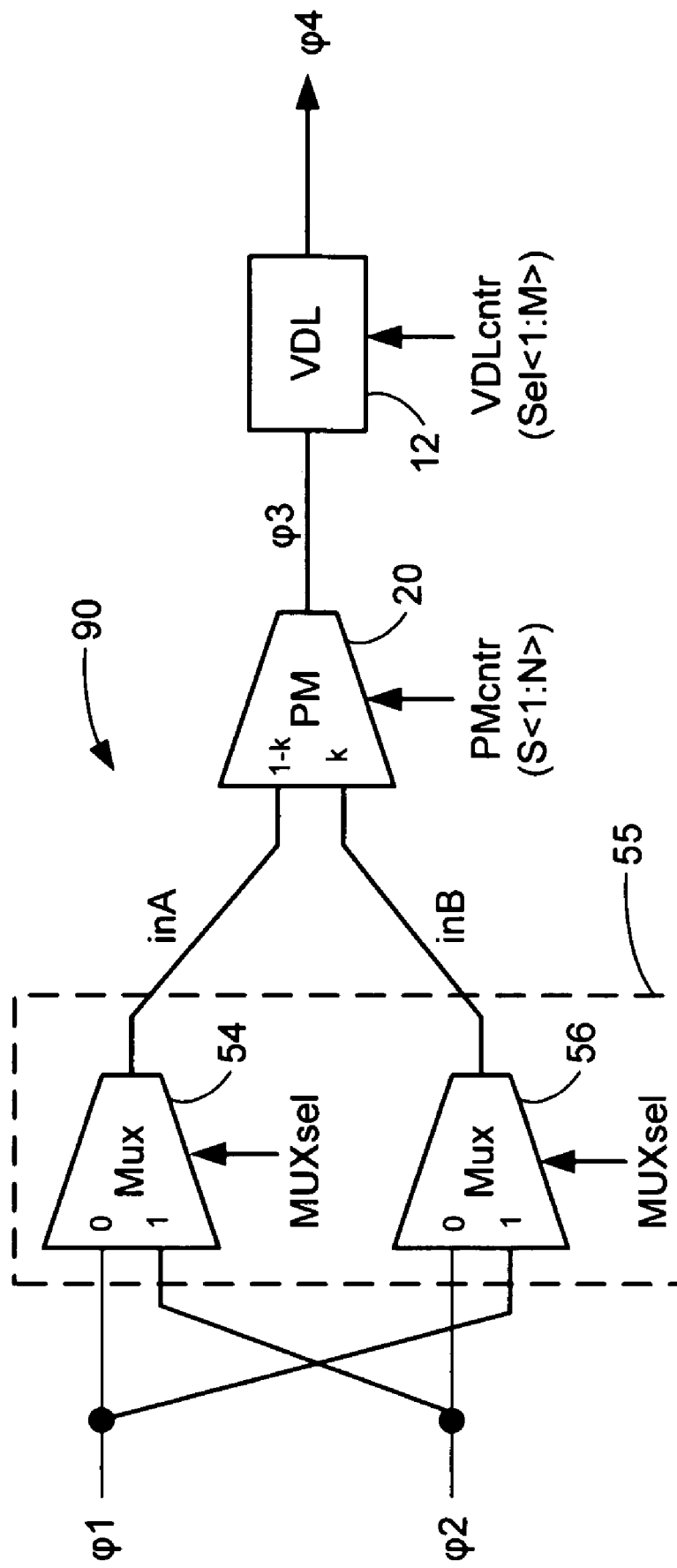
FIG. 6 illustrates the hierarchical delay line used generally in the context with tailoring the phase relative to two oscillating signals.

The basic circuit for the hierarchical delay line can be used in other ways as well. For example, the circuit may be used in contexts other than creating a controlled phase shift between an input and output signal. For example, as shown in the circuit 90 of FIG. 6, the inputs to the multiplexer are generically illustrated as signals having phases $\phi 1$ and $\phi 2$. These signals may be generated from a common signal (such as Clk_In_d was generated from Clk_In), or may be signals that are independent from one another that for some reason need to be mixed and delayed. In this respect, signal $\phi 2$ can represent any sort of generic reference signal relative to signal $\phi 1$.

While particularly useful in a DLL or PLL, one skilled in the art will understand that the disclosed hierarchical delay line 50 has utility in other applications, and in particular in those applications in which precise control is desired between an input and output signal or clock signal.

It should be understood that the inventive concepts disclosed herein are capable of many modifications. To the extent such modifications fall within the scope of the appended claims and their equivalents, they are intended to be covered by this patent.

What is claimed is:

1. A delay line for producing an output signal of a controlled fourth phase relative to a first input signal of a first phase and a second input signal of a second phase, comprising:
   at least one phase mixer block for producing at its output a third phase intermediate the first and second phases, wherein the phase mixer block comprises a first input for receiving either the first input signal or the second input signal, and a second input for receiving the other of the first input signal or the second input signal;
   a switch for controllably determining to which of the first and second inputs the first and second input signals are sent; and
   a delay circuit for receiving the output of the phase mixer block, wherein the delay circuit outputs the output signal with a fourth phase;
   wherein the first input signal, the second input signal, and the output signal all comprise digital clock signals.

2. The delay line of claim 1, wherein the phase mixer block is controllable to weight its output toward the first phase or the second phase.

3. The delay line of claim 1, wherein the delay circuit is controllable to vary its delay.

4. The delay line of claim 3, wherein the delay circuit comprises a multiple of the phase difference between the first phase and the second phase.

5. The delay line of claim 1, wherein the switch comprises a plurality of multiplexers.

6. The delay line of claim 1, wherein the second input signal comprise a reference for the first input signal.

7. The delay line of claim 1, wherein the phase mixer block comprises a single phase mixer.

8. The delay line of claim 1, wherein the phase mixer block comprises one or more sets of serially coupled phase mixers coupled to an output phase mixer.

9. A delay line for controlling a phase difference between an original input signal of a first phase and an output signal, comprising:
   a first delay circuit for creating a delayed input signal from the original input signal comprising a second phase different from the first phase;
   at least one phase mixer block for producing at its output a third phase intermediate the first and second phases, wherein the phase mixer block comprises a first input for receiving either the original input signal or the delayed input signal, and a second input for receiving the other of the original input signal or the delayed input signal;

a switch for determining which of the first and second inputs the original and delayed input signals are sent to; and a second delay circuit for receiving the output of the phase mixer block, wherein the second delay circuit outputs the output signal.

10. The delay line of claim 9, wherein the phase mixer block is controllable to weight its output toward the first phase or the second phase.

11. The delay line of claim 9, wherein the second delay circuit is controllable to vary its delay.

12. The delay line of claim 11, wherein the variable delay circuit comprises a multiple of the phase difference between the first phase and the second phase.

13. The delay line of claim 9, wherein the phase mixer block comprises a single phase mixer.

14. The delay line of claim 9, wherein the phase mixer block comprises one or more sets of serially coupled phase mixers coupled to an output phase mixer.

15. A delay line for controlling a phase difference between an original input signal of a first phase and an output signal, comprising:
a first delay circuit for creating a delayed input signal from the original input signal comprising a second phase different from the first phase;
at least one phase mixer block for producing at its output a third phase intermediate the first and second phases, wherein the phase mixer block comprises a first input for receiving either the original input signal or the delayed input signal, and a second input for receiving the other of the original input signal or the delayed input signal;
a switch for determining which of the first and second inputs the original and delayed input signals are sent to; and
a second delay circuit for receiving the output of the phase mixer block, wherein the second delay circuit outputs the output signal.

16. The delay line of claim 15, wherein the phase mixer block is controllable to weight its output toward the first phase or the second phase.

17. The delay line of claim 15, wherein the second delay circuit is controllable to vary its delay.

18. The delay line of claim 17, wherein the variable delay circuit comprises a multiple of the phase difference between the first phase and the second phase.

19. The delay line of claim 15, wherein the switch comprises a plurality of multiplexers.

20. The delay line of claim 15, wherein the phase mixer block comprises a single phase mixer.

21. The delay line of claim 15, wherein the phase mixer block comprises one or more sets of serially coupled phase mixers coupled to an output phase mixer.

22. A delay line for controlling a phase difference between an original input signal of a first phase and an output signal, comprising:
a first delay circuit for creating a delayed input signal from the original input signal comprising a second phase different from the first phase, wherein the first delay circuit introduces a unit delay;
at least one phase mixer block for producing at its output a third phase intermediate the first and second phases, wherein the phase mixer block comprises a first input for receiving either the original input signal or the delayed input signal, and a second input for receiving the other of the original input signal or the delayed input signal;
a switch for determining which of the first and second inputs the original and delayed input signals are sent to; and
a second delay circuit for receiving the output of the phase mixer block, wherein the second delay circuit outputs the output signal, and wherein the second delay circuit is controllable to produce a delay comprising a multiple number of unit delays.

23. The delay line of claim 22, wherein the phase mixer block is controllable to weight its output toward the first phase or the second phase.

24. The delay line of claim 22, wherein the switch comprises a plurality of multiplexers.

25. The delay line of claim 22, wherein the phase mixer block comprises a single phase mixer.

26. The delay line of claim 22, wherein the phase mixer block comprises one or more sets of serially coupled phase mixers coupled to an output phase mixer.

27. An integrated circuit comprising a delay-locked loop circuit for synchronizing an original input signal of a first phase and an output signal, wherein the delay-locked loop circuit comprises a delay line, wherein the delay line comprises:
a first delay circuit for creating a delayed input signal from the original input signal comprising a second phase different from the first phase;
at least one phase mixer block for producing at its output a third phase intermediate the first and second phases, wherein the phase mixer block comprises a first input for receiving either the original input signal or the delayed input signal, and a second input for receiving the other of the original input signal or the delayed input signal;
a switch for determining which of the first and second inputs the original and delayed input signals are sent to; and
a second delay circuit for receiving the output of the phase mixer block, wherein the second delay circuit outputs the output signal.

28. An integrated circuit comprising a delay-locked loop circuit for synchronizing an original input signal of a first phase and an output signal, wherein the delay-locked loop circuit comprises a delay line, wherein the delay line comprises:
a first delay circuit for creating a delayed input signal from the original input signal comprising a second phase different from the first phase;
at least one phase mixer block for producing at its output a third phase intermediate the first and second phases, wherein the phase mixer block comprises a first input for receiving either the original input signal or the delayed input signal, and a second input for receiving the other of the original input signal or the delayed input signal;
a switch for controllably determining to which of the first and second inputs the original and delayed input signals are sent; and
a second delay circuit for receiving the output of the phase mixer block, wherein the second delay circuit outputs the output signal.

29. An integrated circuit comprising a delay-locked loop circuit for synchronizing an original input signal of a first phase and an output signal, wherein the delay-locked op circuit comprises a delay line, wherein the delay line comprises:
a first delay circuit for creating a delayed input signal from the original input signal comprising a second phase different from the first phase, wherein the first delay circuit introduces a unit delay;

at least one phase mixer block for producing at its output a third phase intermediate the first and second phases, wherein the phase mixer block comprises a first input for receiving either the original input signal or the delayed input signal, and a second input for receiving the other of the original input signal or the delayed input signal;

a switch for controllably determining to which of the first and second inputs the original and delayed input signals are sent; and a second delay circuit for receiving the output of the phase mixer block, wherein the second delay circuit outputs the output signal, and wherein the second delay circuit is controllable to produce a delay comprising a multiple number of unit delays.

30. A delay line for controlling a phase difference between an original input signal of a first phase and an output signal, comprising:

a first delay circuit for creating a delayed input signal from the original input signal comprising a second phase different from the first phase;

at least one phase mixer block for producing at its output a third phase intermediate the first and second phases, wherein the phase mixer block comprises a first input for receiving either the original input signal or the delayed input signal, and a second input for receiving the other of the original input signal or the delayed input signal, wherein the phase mixer block comprises one or more sets of serially coupled phase mixers coupled to an output phase mixer; and a second delay circuit for receiving the output of the phase mixer block, wherein the second delay circuit outputs the output signal.

31. The delay line of claim 30, wherein the phase mixer block is controllable to weight its output toward the first phase or the second phase.

32. The delay line of claim 30, wherein the second delay circuit is controllable to vary its delay.

33. The delay line of claim 32, wherein the variable delay circuit comprises a multiple of the phase difference between the first phase and the second phase.

34. The delay line of claim 30, further comprising a switch for determining which of the first and second inputs the original and delayed input signals are sent to.

* * * * *

UNITED STATES PATENT AND TRADEMARK OFFICE
CERTIFICATE OF CORRECTION

PATENT NO. : 7,274,236 B2 Page 1 of 1
APPLICATION NO. : 11/107587
DATED : September 25, 2007
INVENTOR(S) : Lee It is certified that error appears in the above-identified patent and that said Letters Patent is hereby corrected as shown below:

In column 7, line 33, in Claim 15, after "for" insert -- controllably --.

In column 7, line 33, in Claim 15, after "determining" insert -- to --.

In column 7, line 34, in Claim 15, after "sent" delete "to".

In column 8, line 1, in Claim 22, after "for" insert -- controllably --.

In column 8, line 1, in Claim 22, after "determining" insert -- to --.

In column 8, line 2, in Claim 22, after "sent" delete "to".

In column 8, line 63, in Claim 29, delete "op" and insert -- loop --, therefor.

Signed and Sealed this

Eleventh Day of December, 2007

JON W. DUDAS
*Director of the United States Patent and Trademark Office*